(12) United States Patent
Otani

(10) Patent No.: US 6,316,840 B1
(45) Date of Patent: Nov. 13, 2001

(54) SEMICONDUCTOR DEVICE

(75) Inventor: Hiroshi Otani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/625,541

(22) Filed: Jul. 25, 2000

(30) Foreign Application Priority Data

Feb. 16, 2000 (JP) ................................................ 12-037506

(51) Int. Cl.⁷ .................................................... H01L 23/28
(52) U.S. Cl. .......................................... 257/787; 257/777
(58) Field of Search .................................. 257/787, 790, 257/777, 414, 723, 724, 778

(56) References Cited

U.S. PATENT DOCUMENTS

| | | | |
|---|---|---|---|
| 5,817,545 | * | 10/1998 | Wang et al. . |
| 6,069,023 | * | 5/2000 | Bernier et al. . |
| 6,140,144 | * | 10/2000 | Najafi et al. . |
| 6,172,424 | * | 1/2001 | Kinouchi et al. . |
| 6,204,556 | * | 3/2001 | Hakamata . |
| 6,208,525 | * | 3/2001 | Imasu et al. . |

FOREIGN PATENT DOCUMENTS 5-235315 * 9/1993 (JP) .

* cited by examiner

Primary Examiner—Sheila V. Clark
(74) Attorney, Agent, or Firm—Oblon, Spivak, McClelland, Maier & Neustadt, P.C.

(57) ABSTRACT

A sensor substrate (2) is mounted on a signal processing substrate (1), and a sealing resin (3) is so provided as to extend from an edge portion of the sensor substrate (2) onto a main surface of the signal processing substrate (1). The sealing resin (3) is provided over the whole outer peripheral region of the sensor substrate (2), and the sealing resin (3), the sensor substrate (2) and the signal processing substrate (1) define the sealed space (SP). The sensor substrate (2) has a plurality of bumps (21) on its main surface and makes an electrical connection with the signal processing substrate (1) by bonding the bumps (21) to an electrode provided on the main surface of the signal processing substrate (1). With this structure, a semiconductor device which allows reduction in manufacturing cost by omitting a cap which protects moving part of the sensor substrate can be achieved.

20 Claims, 11 Drawing Sheets

F I G. 17
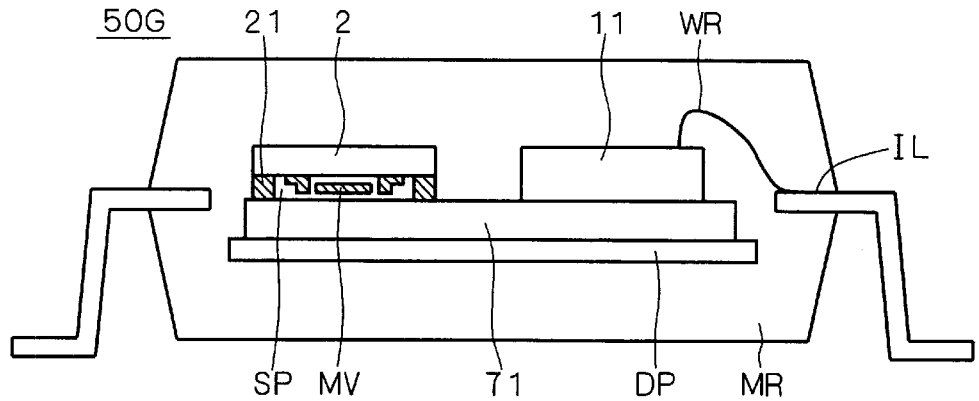
F I G. 18
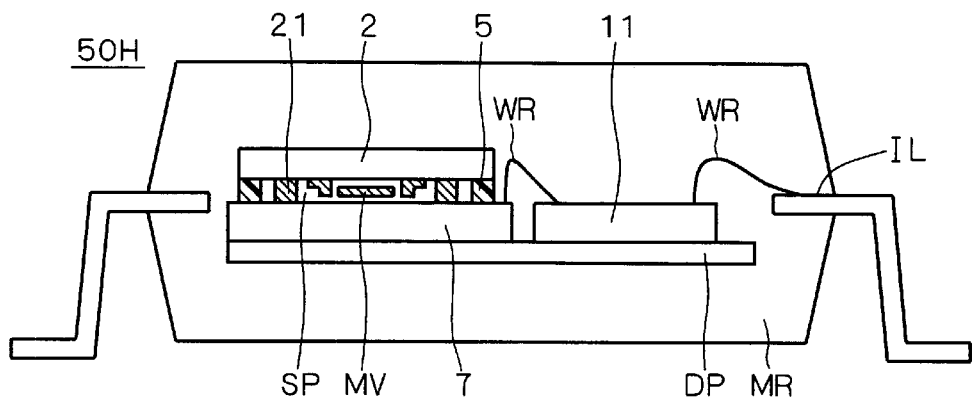
F I G. 19
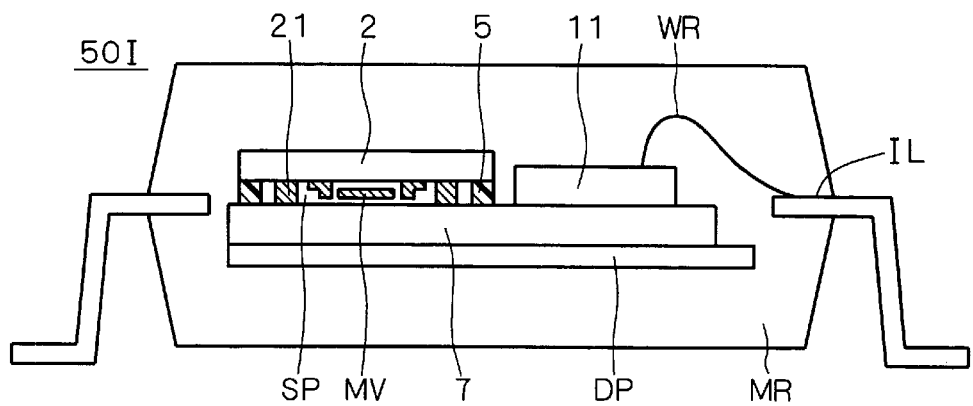

SEMICONDUCTOR DEVICE

BACKGROUND OF THE INVENTION

1. Field of the Invention

The present invention relates to a semiconductor device, and more particularly to a semiconductor device which works as a semiconductor sensor.

2. Description of the Background Art

FIG. 27 is a cross section showing a structure of a semiconductor device 90, as an example of the background-art semiconductor sensor, comprising moving electrodes such as an acceleration sensor, a pressure sensor and an angular velocity sensor. In general, the semiconductor sensor with the moving electrodes has a structure in which the moving electrode is contained in a hollow cavity. In FIG. 27, a moving part MV provided on a main surface of a sensor substrate SC is covered with a hollow cavity CV (hereinafter, referred to as a cap).

The sensor substrate SC has at least a semiconductor substrate (not shown), the moving part MV and a semiconductor element (not shown) for generating an electrical signal according to the displacement of the moving part MV, and the electrical signal generated by the semiconductor element is transmitted to a signal processing substrate AS for performing a predetermined signal processing through a wiring interconnection WR. The signal processing substrate AS has a structure of application specific IC (ASIC) to perform a function of calculating acceleration, pressure and the like on the basis of the electrical signal given from the sensor substrate SC.

The sensor substrate SC and the signal processing substrate As are mounted on a die pad DP of a lead frame and the signal processing substrate AS is electrically connected to an inner lead IL through the wiring interconnection WR. The sensor substrate SC and the signal processing substrate AS are sealed by a mold resin MR together with the die pad DP and the inner lead IL, whereby a resin-sealed package is achieved.

FIG. 28 is a perspective view showing a state before the semiconductor device 90 is sealed by the resin. As shown in FIGS. 27 and 28, the die pad DP in the semiconductor device 90 has such a depressed die pad structure as to be lower in position than the inner lead IL. This structure makes the inner lead IL and the surface of the semiconductor substrate such as the signal processing substrate As on the die pad DP almost flush in height, thereby facilitating wire bonding.

The cross section taken along the line A—A of FIG. 28 corresponds to the structure view shown in FIG. 27.

Further, FIG. 29 is a conceptional view showing a structure of the moving part MV in the sensor substrate SC. As shown in FIG. 29, the moving part MV has a moving electrode MVP which is movably supported by a beam BM and a fixed electrode FXP which is so provided as to have a clearance between the moving electrode MVP and itself and form static capacitance therebetween.

The fixed electrode FXP is an electrode of semiconductor element having a structure to detect variation of static capacitance generated by the displacement of the moving electrode MVP. The cross section taken along the line B—B of FIG. 29 is shown in FIG. 30.

Thus, the sensor substrate SC needs to ensure the movement of the moving electrode MVP and therefore the moving part MV is covered with a cap CV made of silicon or glass to prevent the mold resin MR from entering.

Providing the cap, however, causes problems of an increase in manufacturing cost due to not only an increase in the number of parts but also necessity of a process to bond the cap CV on the sensor substrate SC.

SUMMARY OF THE INVENTION

The present invention is directed to a semiconductor device. According to a first aspect of the present invention, the semiconductor device comprises: a sensor substrate comprising a moving part on a first main surface thereof, for converting the displacement of the moving part into an electrical signal and outputting the electrical signal; an opposed substrate opposed to the first main surface of the sensor substrate, for transmitting the electrical signal with the sensor substrate through a bump provided around the moving part; and a sealing member provided at least in an edge portion of a gap defined by the sensor substrate and the opposed substrate, and in the semiconductor device of the first aspect, a sealed space is defined by the sensor substrate, the opposed substrate and the sealing member.

According to a second aspect of the present invention, in the semiconductor device according to the first aspect, the opposed substrate is a signal processing substrate for performing a predetermined processing on the electrical signal from the sensor substrate, and the sensor substrate is provided on the signal processing substrate.

According to a third aspect of the present invention, the semiconductor device according to the first aspect further comprises a signal processing substrate for performing a predetermined processing on the electrical signal from the sensor substrate, and in the semiconductor device of the third aspect, the opposed substrate is a wiring board having a wiring pattern to transmit the electrical signal from the sensor substrate to the signal processing substrate, and the sensor substrate is provided on the wiring board.

According to a fourth aspect of the present invention, in the semiconductor device according to the second aspect, the sealing member is made of resin and so provided as to cover only the edge portion of the gap defined by the sensor substrate and the opposed substrate.

According to a fifth aspect of the present invention, in the semiconductor device according to the second aspect, the sealing member is made of resin and so provided as to entirely cover the sensor substrate.

According to a sixth aspect of the present invention, in the semiconductor device according to the fifth aspect, the resin is silicone gel.

According to a seventh aspect of the present invention, the semiconductor device according to the fifth aspect further comprises: a barrier provided so as to surround at least the sensor substrate, having such a height as to reach a second main surface opposite to the first main surface of the sensor substrate, and in the semiconductor device of the seventh aspect, the resin is so provided as to fill the inside of the barrier.

According to an eighth aspect of the present invention, in the semiconductor device according to the second aspect, the sealing member is made of glass and provided between an edge portion of the first main surface of the sensor substrate and a main surface of the opposed substrate.

According to a ninth aspect of the present invention, in the semiconductor device according to the eighth aspect, the glass includes at least PbO.

According to a tenth aspect of the present invention, in the semiconductor device according to the second aspect, the sealing member is made of eutectic alloy including at least silicon and provided between an edge portion of the first main surface of the sensor substrate and a main surface of the opposed substrate.

According to an eleventh aspect of the present invention, in the semiconductor device according to the tenth aspect, the opposed substrate comprises a concave portion provided in the main surface of the opposed substrate correspondingly to a region in which the moving part and the bump of the sensor substrate are provided, and the moving part and the bump are partially contained in the concave portion.

According to a twelfth aspect of the present invention, in the semiconductor device according to the tenth aspect, the eutectic alloy further includes nickel and titanium.

According to a thirteenth aspect of the present invention, the semiconductor device comprises: a sensor substrate comprising a moving part on a first main surface thereof, for converting the displacement of the moving part into an electrical signal and outputting the electrical signal; and an opposed substrate opposed to the first main surface of the sensor substrate, for transmitting the electrical signal with the sensor substrate through a bump provided around the moving part, and in the semiconductor device of the thirteenth aspect, a gap defined by the sensor substrate and the opposed substrate has a size not smaller than 2 $\mu$m and not larger than 10 $\mu$m.

Since the semiconductor device of the first aspect of the present invention comprises the sealing member provided at least in the edge portion of the gap defined by the sensor substrate and the opposed substrate, this structure prevents extraneous matters such as dust from entering the sealed space in the manufacturing stage and also prevents the mold resin from entering the sealed space when the sensor substrate and opposed substrate are molded by the resin, and therefore it is possible to prevent impediment to an operation of the moving part existing inside the sealed space. Further, this structure eliminates the necessity of a dedicated member to protect the moving part, and therefore allows reduction in manufacturing cost by reduction in the number of parts and the number of process steps. Furthermore, since the sensor substrate and the opposed substrate are connected by flip chip bonding, the electrical signal from the sensor substrate can be accurately obtained with parasitic capacity reduced.

In the semiconductor device of the second aspect of the present invention, since the sensor substrate is provided on the signal processing substrate, it is possible to reduce the area of the device as compared with a case where the sensor substrate and the signal processing substrate are provided on the same plane.

In the semiconductor device of the third aspect of the present invention, since the sensor substrate is provided on the wiring board, the device electrically connected to the sensor substrate is provided on the wiring board and the electrical signal from the sensor substrate can be thereby accurately obtained with parasitic capacity reduced.

In the semiconductor device of the fourth aspect of the present invention, since the resin used as the sealing member is so provided as to cover only the edge portion of the gap defined by the sensor substrate and the opposed substrate, only a small amount of resin is needed and the providing process therefor is facilitated.

In the semiconductor device of the fifth aspect of the present invention, since the resin used as the sealing member is so provided as to entirely cover the sensor substrate, with a low-viscosity resin used as the resin, it is possible to prevent the sensor substrate from being distorted and broken by a thermal stress generated in forming the mold resin when the sensor substrate and opposed substrate are molded by the resin.

In the semiconductor device of the sixth aspect of the present invention, since silicone gel is used as the sealing member, the sensor substrate can be protected by the low-viscosity resin.

In the semiconductor device of the seventh aspect of the present invention, since the resin is so provided as to fill the inside of the barrier surrounding at least the sensor substrate, the region in which the resin is provided can be limited.

In the semiconductor device of the eighth aspect of the present invention, since the sealing member is made of glass, a sealing member of excellent strength can be achieved.

In the semiconductor device of the ninth aspect of the present invention, since the glass including at least PbO is used, the melting and solidification can easily take place as the glass has a low melting point and therefore the manufacture is facilitated.

In the semiconductor device of the tenth aspect of the present invention, since the sealing member is made of eutectic alloy including at least silicon, a sealing member of excellent strength can be achieved.

Since the semiconductor device of the eleventh aspect of the present invention comprises the concave portion provided in the main surface of the opposed substrate and the moving part and the bump are partially contained in the concave portion, the height of the eutectic alloy of which the sealing member is made can be lowered and the time needed for forming the sealing member can be reduced.

In the semiconductor device of the twelfth aspect of the present invention, since the eutectic alloy includes nickel and titanium, the melting and solidification can easily take place as the melting point in forming the eutectic alloy is low and therefore the manufacture is facilitated.

In the semiconductor device of the thirteenth aspect of the present invention, since the gap defined by the sensor substrate and the opposed substrate has a size not smaller than 2 $\mu$m and not larger than 10 $\mu$m, this structure prevents the mold resin molten in forming the mold resin from entering the gap due to physical factors such as surface tension when the sensor substrate and the opposed substrate are molded by the resin, and therefore it is possible to prevent impediment to an operation of the moving part existing inside the gap.

An object of the present invention is to provide a semiconductor device which allows reduction in manufacturing cost by omitting the cap CV.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 11 to 21 are cross sections showing structures of a semiconductor device in accordance with variations of the fifth preferred embodiment of the present invention;

DESCRIPTION OF THE PREFERRED EMBODIMENTS

A. The First Preferred Embodiment

A-1. Device Structure

Figure 1:
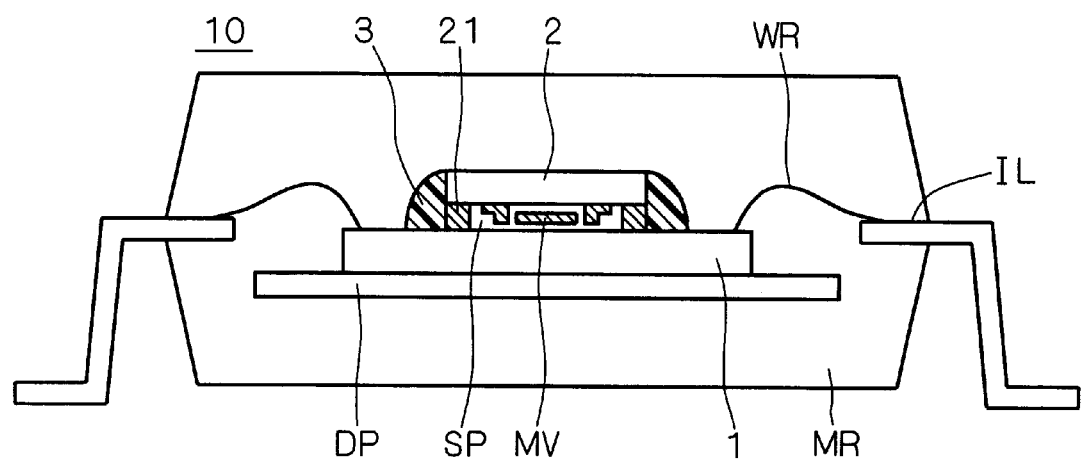
FIG. 1 is a cross section showing a structure of a semiconductor device in accordance with a first preferred embodiment of the present invention.

As the first preferred embodiment of the semiconductor device in accordance with the present invention, a cross section of a semiconductor device 10 is shown in FIG. 1.

In FIG. 1, a signal processing substrate 1 is mounted on the die pad DP of depressed die pad structure and a sensor substrate 2 is mounted on the signal processing substrate 1.

The sensor substrate 2 has the moving part MV provided on its main surface (the first main surface) and a plurality of protruding electrodes (hereinafter, referred to as bumps) 21 provided around the moving part MV, and is a semiconductor substrate of flip chip bonding type (hereinafter, referred to as flip chip type) to make an electrical connection with the signal processing substrate 1 by bonding the bumps 21 to an electrode (not shown) provided on a main surface of the signal processing substrate 1. This structure needs no wiring interconnection for electrical connection between the signal processing substrate 1 and the sensor substrate 2 and thereby allows reduction in static capacity.

Figure 29:
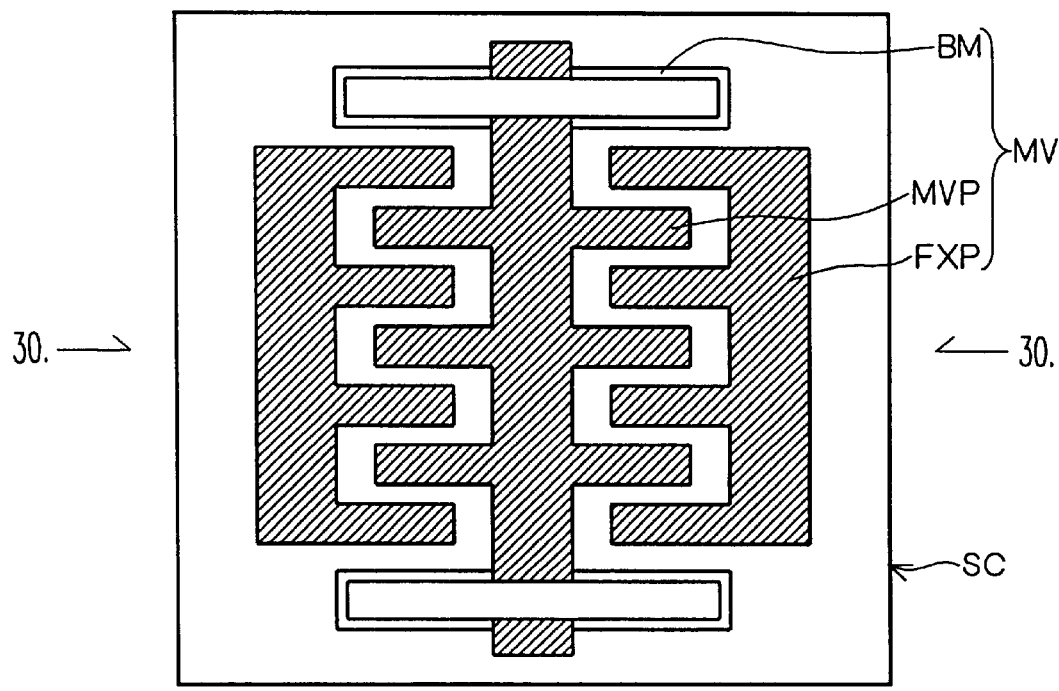
FIG. 29 is a plan view showing a structure of a moving part of a sensor substrate.
Figure 30:
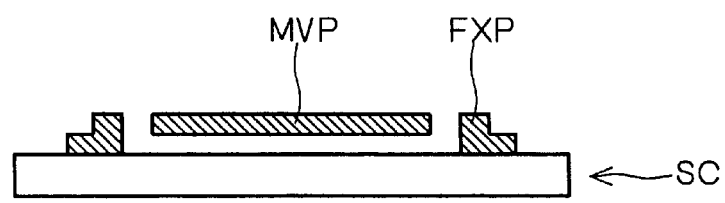
FIG. 30 is a cross section showing the structure of the moving part of the sensor substrate.

Connecting the signal processing substrate 1 and sensor substrate 2 by flip chip bonding makes the moving part MV face the main surface of the signal processing substrate 1. Further, the structure of the moving part MV is the same as that in the sensor substrate SC shown in FIG. 29.

Furthermore, a clearance is provided between the moving part MV and the main surface of the signal processing substrate 1 so as to prevent the moving part MV and the main surface of the signal processing substrate 1 from coming into contact with each other.

Thus, the moving part MV is so provided as not to come into contact with the main surface of the signal processing substrate 1, and the signal processing substrate 1 also serves as a stopper to prevent the moving electrode (not shown) which is a constituent of the moving part MV from unlimitedly moving in a direction opposite to the main surface of the sensor substrate 2.

The area of the signal processing substrate 1 is larger than that of the sensor substrate 2, and a sealing resin 3 (sealing member) is so provided as to extend from an edge portion of the sensor substrate 2 onto the main surface of the signal processing substrate 1. The sealing resin 3 is provided over the whole outer peripheral region of the sensor substrate 2, and the sealing resin 3, the sensor substrate 2 and the signal processing substrate 1 define the sealed space SP.

The signal processing substrate 1 is electrically connected to the inner lead IL through the wiring interconnection WR. The sensor substrate 2 and the signal processing substrate 1 are sealed by the mold resin MR together with the die pad DP and the inner lead IL.

For the sealing resin 3, a high-viscosity material such as silicone resin or epoxy resin is used so as to be hard to enter the very small clearance (about 10 μm) between the sensor substrate 2 and signal processing substrate 1 before hardening and therefore no sealing resin 3 enters the sealed space SP.

A-2. Function and Effect

Thus, this structure in which the sensor substrate 2 is mounted on the signal processing substrate 1 so that the moving part MV may face the main surface of the signal processing substrate 1 and the edge portion of the sensor substrate 2 is covered with the sealing resin 3 prevents extraneous matters such as dust from entering the sealed space SP in the manufacturing stage and also prevents the molten mold resin MR from entering the sealed space SP in forming the mold resin MR, and therefore it is possible to prevent impediment to an operation of the moving electrode (not shown) which is a constituent of the moving part MV existing inside the sealed space SP.

Figure 27:
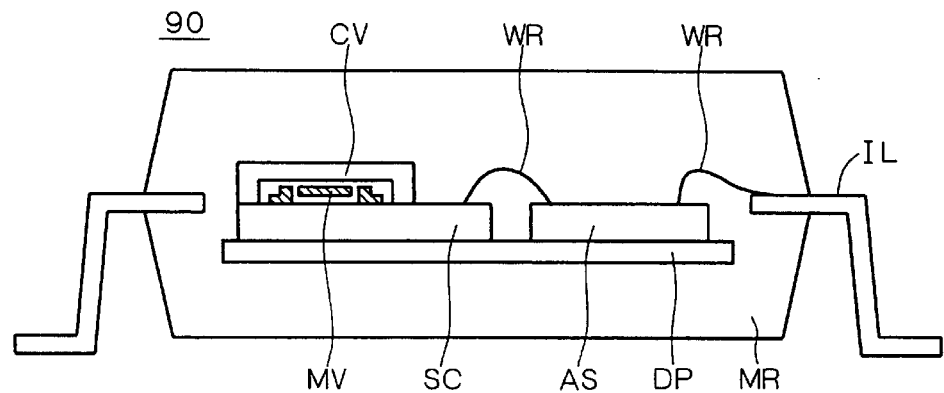
FIG. 27 is a cross section showing a structure of a semiconductor device in the background art.
Figure 28:
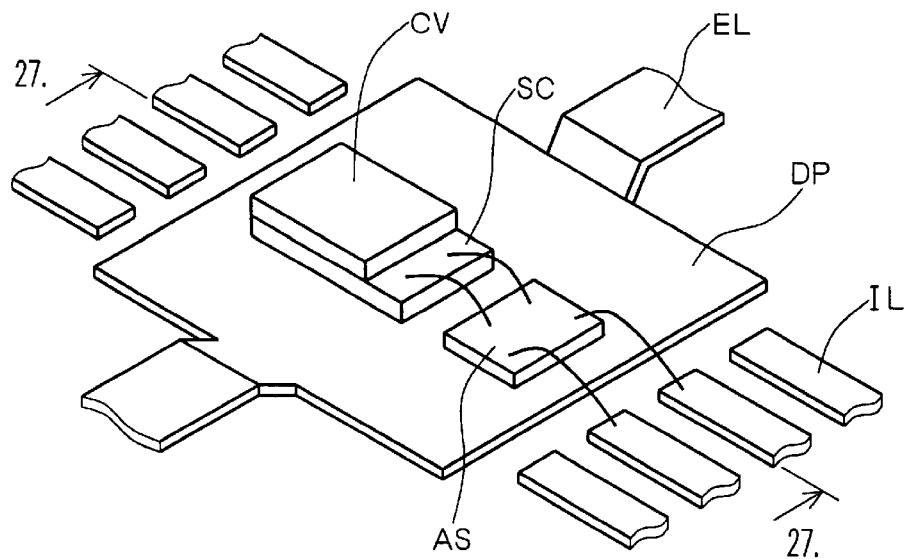
FIG. 28 is a perspective view showing the structure of the semiconductor device in the background art.

Further, this structure eliminates the necessity of a dedicated member to protect the moving part, such as the cap CV (see FIG. 27) in the background-art semiconductor device, and therefore allows reduction in manufacturing cost by reduction in the number of parts and the number of process steps.

Furthermore, since the sealing resin 3 is provided only over the edge portion of the sensor substrate 2, only small amount is needed and the providing process therefor is facilitated.

A-3. The First Variation

Figure 2:
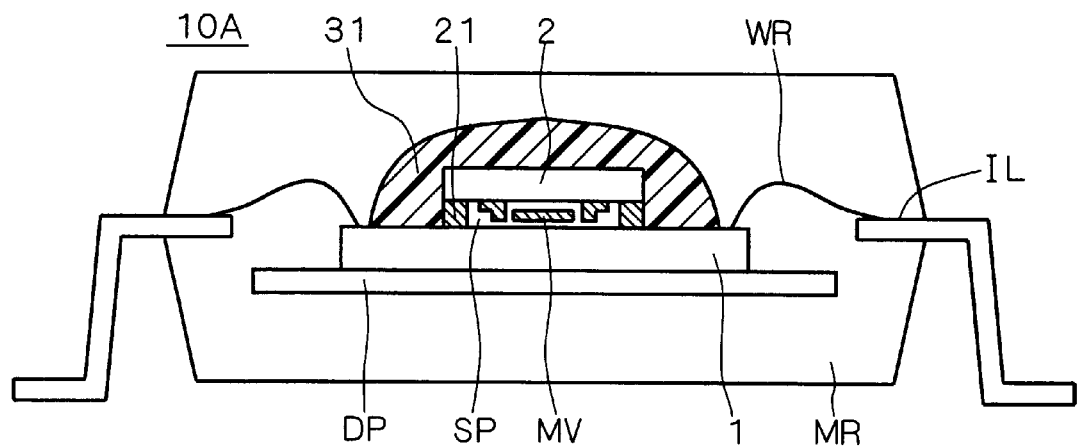
FIGS. 2 to 6 are cross sections showing structures of a semiconductor device in accordance with variations of the first preferred embodiment of the present invention.

Though the semiconductor device 10 shown in FIG. 1 has the structure in which the sealing resin 3 is so provided as to cover only the edge portion of the sensor substrate 2, there may be another structure, like a semiconductor device 10A as shown in FIG. 2, in which a sealing resin 31 made of a low-viscosity resin such as a silicone gel is used, instead of the sealing resin 3, to entirely cover the sensor substrate 2.

The sealing resin 31 made of silicone gel is a low-viscosity resin having modulus of elasticity of e.g., not higher than 9800 N/mm$^2$ (1000 kgf/mm$^2$), and serves as a cushion against an external force by entirely covering the sensor substrate 2, to prevent the sensor substrate 2 from being distorted and broken with a thermal stress generated in forming the mold resin MR applied to the sensor substrate 2.

A-4. The Second Variation

Though the semiconductor device 10A shown in FIG. 2 has the structure in which the sealing resin 31 of low viscosity is so provided as to entirely cover the sensor substrate 2, the silicone gel is rich in fluidity before hardening and therefore it is sometimes hard to stop it within a desired region on the signal processing substrate 1 when it is applied thereto.

Figure 3:
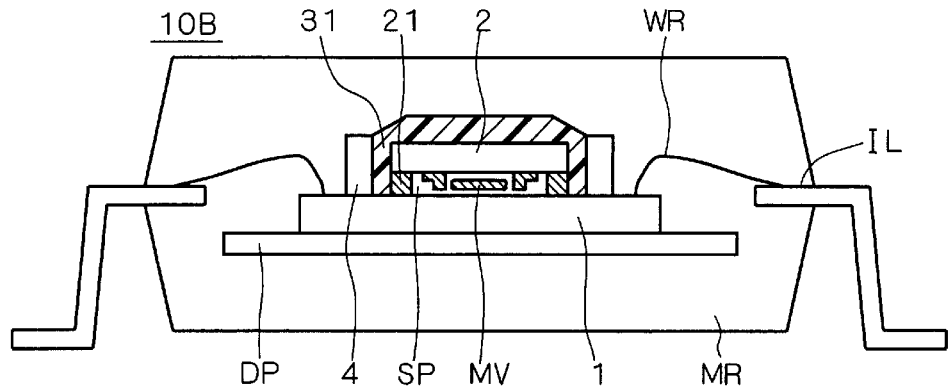

Then, there may be another structure, like a semiconductor device 10B as shown in FIG. 3, in which a barrier 4 is provided on the signal processing substrate 1 so as to surround the outer periphery of the sensor substrate 2 and the silicone gel is flowed into a region surrounded by the barrier 4 to form the sealing resin 31.

The barrier 4 is made of resin or metal, and the barrier 4 of ring shape or rectangular-ring shape prepared in advance may be bonded to the signal processing substrate 1.

If the barrier 4 is made of resin, plastic resin such as polybutylene terephthalate (PBT) or polyphenylene sulfide (PPS) may be used.

Further, the sensor substrate 2 can be reliably covered only if the height of the barrier 4 is set not lower than such a height as to reach a main surface (the second main surface) opposite to the first main surface of the sensor substrate 2 in a state where the barrier 4 is provided on the signal processing substrate 1.

A-5. The Third Variation

Figure 4:
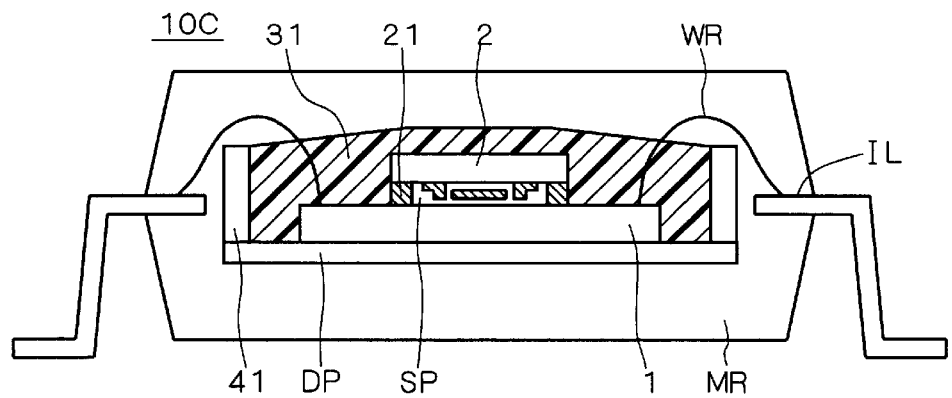

Though the semiconductor device 10B shown in FIG. 3 has the structure in which the barrier 4 is provided on the signal processing substrate 1 so as to surround the outer periphery of the sensor substrate 2, there may be another structure, like a semiconductor device 10C as shown in FIG. 4, in which a barrier 41 instead of the barrier 4 is provided on the die pad DP so as to surround the outer periphery of the signal processing substrate 1 and the silicone gel is flowed into a region surrounded by the barrier 41 to form the sealing resin 31.

With such a structure, both the signal processing substrate 1 and the sensor substrate 2 are covered with the sealing resin 31, and thereby the signal processing substrate 1 can be also protected from the thermal stress in forming the mold resin MR.

Further, both the signal processing substrate 1 and the sensor substrate 2 can be reliably covered only if the height of the barrier 41 is set not lower than such a height as to reach the second main surface of the sensor substrate 2 in a state where these elements are provided on the die pad DP.

A-6. The Fourth Variation

Though the semiconductor devices in accordance with the first to third variations of the first preferred embodiment as discussed above each have the structure in which the sensor substrate 2 is mounted on the signal processing substrate 1, it is natural that there may be another structure in which the signal processing substrate 1 is mounted on the sensor substrate 2.

Figure 5:
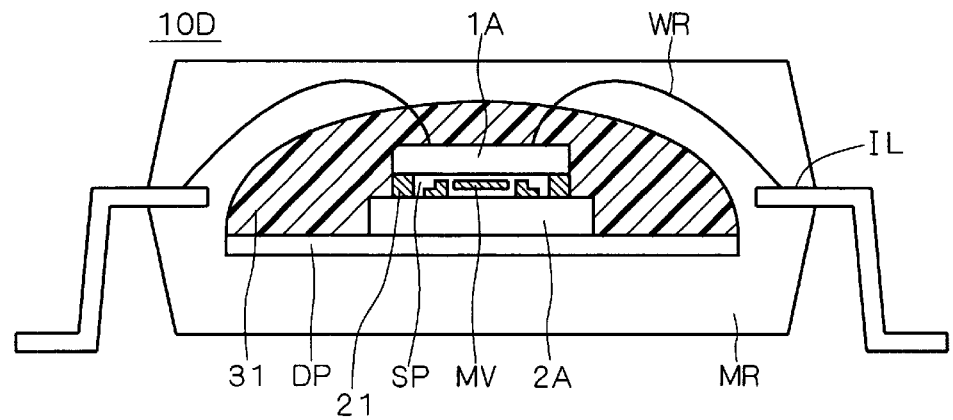

In a semiconductor device 10D shown in FIG. 5, for example, a sensor substrate 2A is mounted on the die pad DP of sink structure and a signal processing substrate 1A is mounted on the sensor substrate 2A.

Though the structures of the signal processing substrate 1A and sensor substrate 2A are basically the same as those of the signal processing substrate 1 and the sensor substrate 2 described with reference to FIG. 1, the area of the sensor substrate 2A is larger than that of the signal processing substrate 1 and the signal processing substrate 1A is entirely covered with the sealing resin 31 and the sensor substrate 2A is also covered with the sealing resin 31.

With such a structure, it is possible to protect both the signal processing substrate 1A and the sensor substrate 2A from the thermal stress in forming the mold resin MR.

A-7. The Fifth Variation

Figure 6:
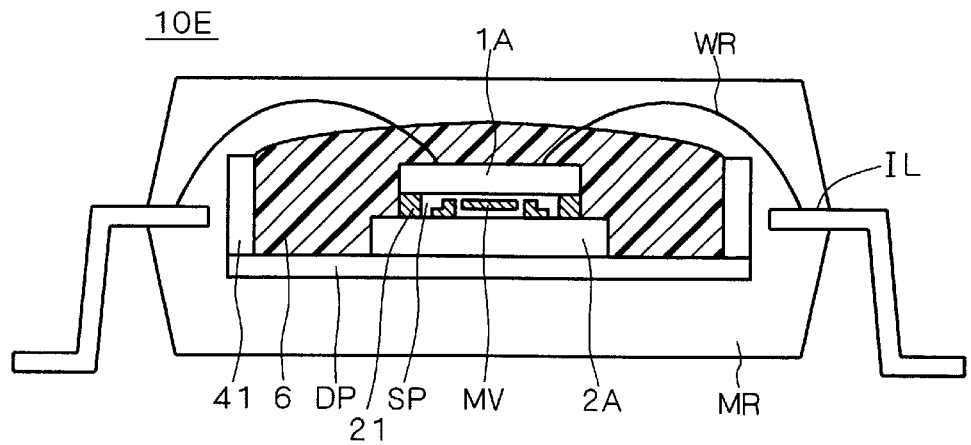

Further, there may be another structure, like a semiconductor device 10E as shown in FIG. 6, in which the barrier 41 is provided on the die pad DP so as to surround the outer periphery of the sensor substrate 2A and the silicone gel is flowed into the region surrounded by the barrier 41 to form the sealing resin 31.

With such a structure, it is possible to stop the fluid silicone gel within a desired region and prevent the silicone gel from extending off the die pad DP.

Further, both the signal processing substrate 1A and the sensor substrate 2A can be reliably covered only if the height of the barrier 41 is set not lower than the sum of the height of the signal processing substrate 1A and that of the sensor substrate 2A in a state where these elements are provided on the die pad DP.

B. The Second Preferred Embodiment

B-1. Device Structure

Figure 7:
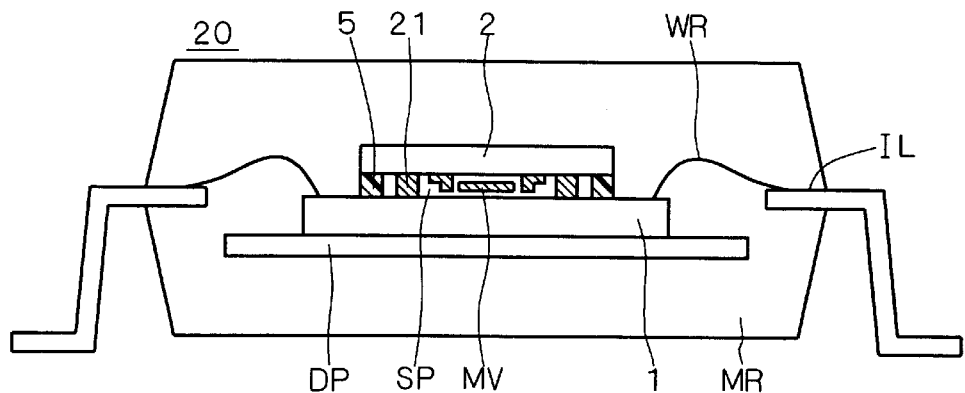
FIG. 7 is a cross section showing a structure of a semiconductor device in accordance with a second preferred embodiment of the present invention.

As the second preferred embodiment of the semiconductor device in accordance with the present invention, a cross section of a semiconductor device 20 is shown in FIG. 7.

In FIG. 7, the signal processing substrate 1 is mounted on the die pad DP and the sensor substrate 2 is mounted on the signal processing substrate 1. A sealing glass 5 (sealing member) made of low melting point glass is provided in the edge portion of the main surface (the first main surface) of the sensor substrate 2 where the moving part MV is provided, along its entire perimeter, and the sealing glass 5, the sensor substrate 2 and the signal processing substrate 1 define the sealed space SP. Further, other constituent elements identical to those in the semiconductor device 10 described with reference to FIG. 1 are represented by the same reference signs and redundant description thereon will be omitted.

As the low melting point glass of which the sealing glass 5 is made, an amorphous glass frit including PbO which melts at the sealing temperature ranging from 400° to 450° C. is used. The glass frit powder is mixed with a solvent into a resin binder and converted to paste (glass paste). The glass paste is provided on the first main surface of the sensor substrate 2 by screen printing, by dispensing method in which quantitative coating is made by pushing out from a nozzle, by stamping method in which the glass paste is used as an ink of stamp to transfer the shape of the sealing glass 5 and the like. Then, after superimposing the sensor substrate 2 on the signal processing substrate 1, the paste is solidified by heating and the signal processing substrate 1 and the sensor substrate 2 are bonded with the sealing glass 5.

Since the solidification of the glass paste is performed concurrently with flip chip bonding with the bump 21, the process can be simplified. At that time, to prevent the heating for solidification of the glass paste from affecting the bump 21, it is necessary to set the melt temperature of the bump 21 higher than the solidification temperature of the glass paste or limit the heating region of the glass paste and that of the bump 21.

B-2. Function and Effect

Presence of the sealing glass 5 prevents extraneous matters such as dust from entering the sealed space SP in the manufacturing stage and also prevents the molten mold resin MR from entering the sealed space SP in forming the mold resin MR, and therefore it is possible to prevent impediment to the operation of the moving electrode (not shown) which is a constituent of the moving part MV existing inside the sealed space SP. Further, use of glass makes it possible to achieve a sealing member of excellent strength.

C. The Third Preferred Embodiment

C-1. Device Structure

Figure 8:
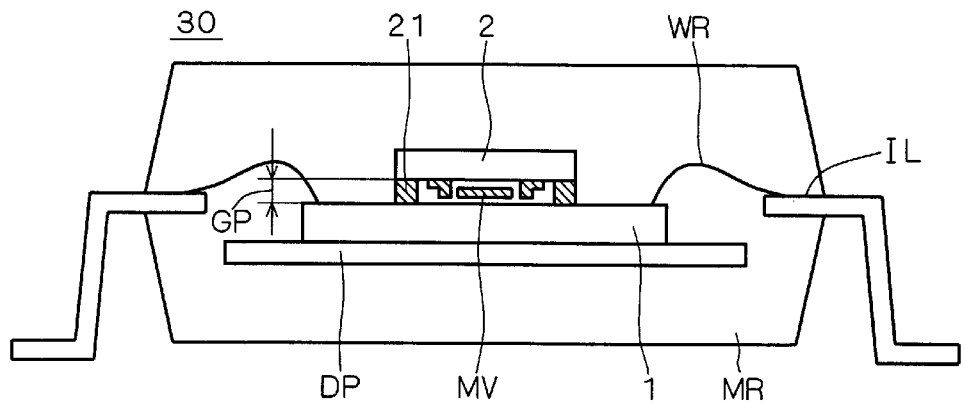
FIG. 8 is a cross section showing a structure of a semiconductor device in accordance with a third preferred embodiment of the present invention.

As the third preferred embodiment of the semiconductor device in accordance with the present invention, a cross section of a semiconductor device 30 is shown in FIG. 8.

In FIG. 8, the signal processing substrate 1 is mounted on the die pad DP and the sensor substrate 2 is mounted on the signal processing substrate 1.

The sensor substrate 2 has the moving part MV provided on its main surface (the first main surface) and the bumps 21 are provided on a side of the first main surface. Connecting the signal processing substrate 1 and sensor substrate 2 by flip chip bonding makes the moving part MV face the main surface of the signal processing substrate 1. The height of the bump 21 is set so that the gap GP between the sensor substrate 2 and the signal processing substrate 1 may have a size not larger than 10 μm. Further, other constituent elements identical to those in the semiconductor device 10 described with reference to FIG. 1 are represented by the same reference signs and redundant description thereon will be omitted.

C-2. Function and Effect

Thus, setting the height of the bump 21 so that the gap GP may have a size not larger than 10 μm prevents the molten mold resin MR from entering the gap GP through the clearance between the bumps 21 in forming the mold resin MR due to physical factors such as surface tension, and therefore it is possible to prevent impediment to the operation of the moving electrode (not shown) which is a constituent of the moving part MV existing inside the gap GP.

Further, since the height of the bump 21 can be limitedly lowered and the gap should have a size of about 2 to 3 μm to provide the moving part MV therein, the lowest height of the bump 21 is about 2 to 3 μm.

D. The Fourth Preferred Embodiment

D-1. Device Structure

Figure 9A:
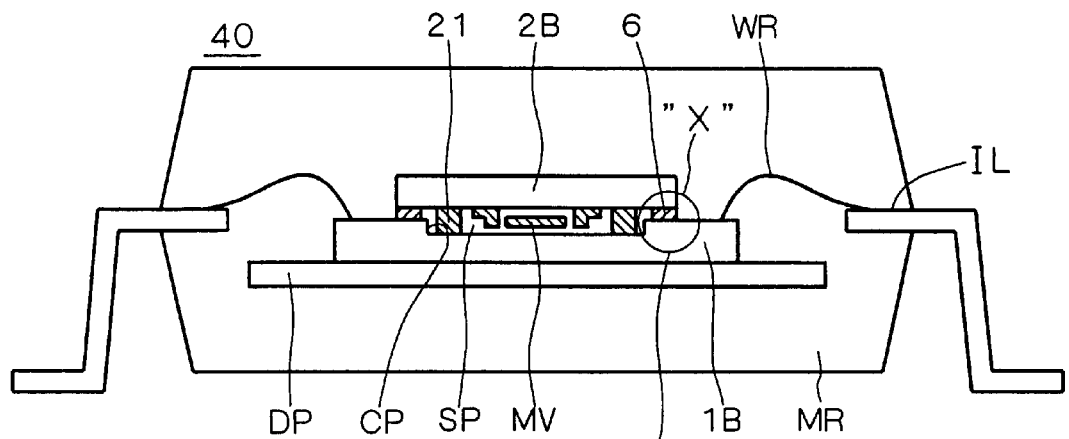
FIG. 9 is a cross section showing a structure of a semiconductor device in accordance with a fourth preferred embodiment of the present invention.
Figure 9B:
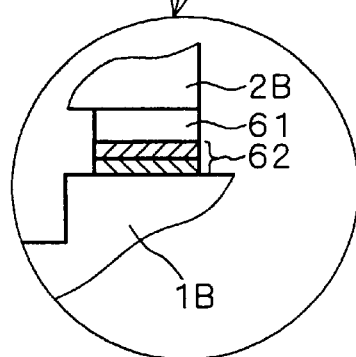

As the fourth preferred embodiment of the semiconductor device in accordance with the present invention, a cross section of a semiconductor device 40 is shown in FIG. 9.

In FIG. 9, a signal processing substrate 1B is mounted on the die pad DP and a sensor substrate 2B is mounted on the signal processing substrate 1B.

The sensor substrate 2B has the moving part MV provided on its main surface (the first main surface) and a plurality of bumps 21 provided around the moving part MV. Connecting the signal processing substrate 1B and sensor substrate 2B by flip chip bonding makes the moving part MV face the main surface of the signal processing substrate 1B.

On the main surface of the signal processing substrate 1B facing the moving part MV provided is a concave portion CP having a size corresponding to a region in which the bumps 21 and the moving part MV are formed. Further, other constituent elements identical to those in the semiconductor device 10 described with reference to FIG. 1 are represented by the same reference signs and redundant description thereon will be omitted.

A sealing wall 6 (sealing member) is provided between the edge portion of the first main surface of the sensor substrate 2B and an outer peripheral portion of the concave portion CP of the signal processing substrate 1B, along the entire perimeter of the concave portion CP, and the sealing wall 6, the sensor substrate 2B and the signal processing substrate 1B define the sealed space SP. The sealing wall 6 is made of eutectic alloy consisting of silicon, titanium and nickel.

FIG. 9 is a detail view showing a region X in a state before eutectic reaction takes place, for clarification.

As shown in the detail view of the region X, the sealing wall 6 is formed by causing the eutectic reaction between a polysilicon layer 61 provided along the entire perimeter of the edge portion in the first main surface of the sensor substrate 2B and a titanium-nickel layer 62 provided along the whole outer perimeter of the concave portion CP in the signal processing substrate 1B.

The polysilicon layer 61 is formed by, e.g., chemical vapor deposition (CVD) method to have a thickness of 2 to 3 μm. The moving electrode in the moving part MV (see FIG. 29) is also made of polysilicon and therefore, by forming the polysilicon layer 61 concurrently with formation of the moving electrode, it is possible to suppress an increase of manufacturing process steps.

The titanium-nickel layer 62 is a layer in which titanium and nickel are layered, and formed by sputtering method to have a thickness of e.g., 50 nm (500 Å) in the titanium layer and 200 nm (2000 Å) in the nickel layer. The order of layering the titanium layer and the nickel layer is not particularly limited.

Further, since it is necessary to make the polysilicon layer 61 and the titanium-nickel layer 62 thick in order to ensure a clearance large enough to provide the moving part MV between the signal processing substrate 1B and the sensor substrate 2B only with the sealing wall 6 and the polysilicon layer 61 is formed in the same process as the moving electrode is formed, there arise problems that the extra process step is needed to thicken only the polysilicon layer 61 and it takes more time to thickly form the titanium-nickel layer.

Then, by providing the concave portion CP in the signal processing substrate 1B, the clearance large enough to provide the moving part MV can be ensured with the height of the sealing wall 6 made low.

Further, if there is no need to consider the limitation on the number of process steps, manufacturing time and the like, it is natural that there may be other structures where the gap is provided between the signal processing substrate 1B and the sensor substrate 2B only with the sealing wall 6 without providing the concave portion CP, where the polysilicon layer 61 is provided on the side of the signal processing substrate 1B and the titanium-nickel layer 62 is provided on the side of the sensor substrate 2B and where the polysilicon layer 61 is provided on both the signal processing substrate 1B and the sensor substrate 2B.

The sealing wall 6 is formed by superimposing the sensor substrate 2B on the signal processing substrate 1B so that the polysilicon layer 61 of the sensor substrate 2B and the titanium-nickel layer 62 of the signal processing substrate 1B may be layered and then heating them at about 400° to 450° C. to cause the eutectic reaction.

Further, the layer on the signal processing substrate 1B is not limited to the titanium-nickel layer 62 only if the material thereof can cause the eutectic reaction with silicon, and a single layer made of gold or aluminum may be used instead of the titanium-nickel layer 62.

D-2. Function and Effect

Presence of the sealing wall 6 prevents extraneous matters such as dust from entering the sealed space SP in the manufacturing stage and also prevents the molten mold resin MR from entering the sealed space SP in forming the mold resin MR, and therefore it is possible to prevent impediment to the operation of the moving electrode (not shown) which is a constituent of the moving part MV existing inside the sealed space SP. Further, use of the eutectic alloy makes it possible to achieve a sealing member of excellent strength.

Further, since the melting point in forming the eutectic alloy is lowered by using the eutectic alloy consisting of silicon, titanium and nickel as the sealing member, the melting and solidification can easily take place and therefore the manufacture is facilitated.

E. The Fifth Preferred Embodiment

E-1. Device Structure

Though the semiconductor devices in accordance with the first to fourth preferred embodiments of the present invention as discussed above each have the structure in which the cap CV in the background-art semiconductor device (see FIG. 27) can be omitted by superimposing the sensor substrate on the signal processing substrate, the fifth preferred embodiment shows a structure in which the cap CV can be omitted by superimposing the sensor substrate on a wiring board.

Figure 10:
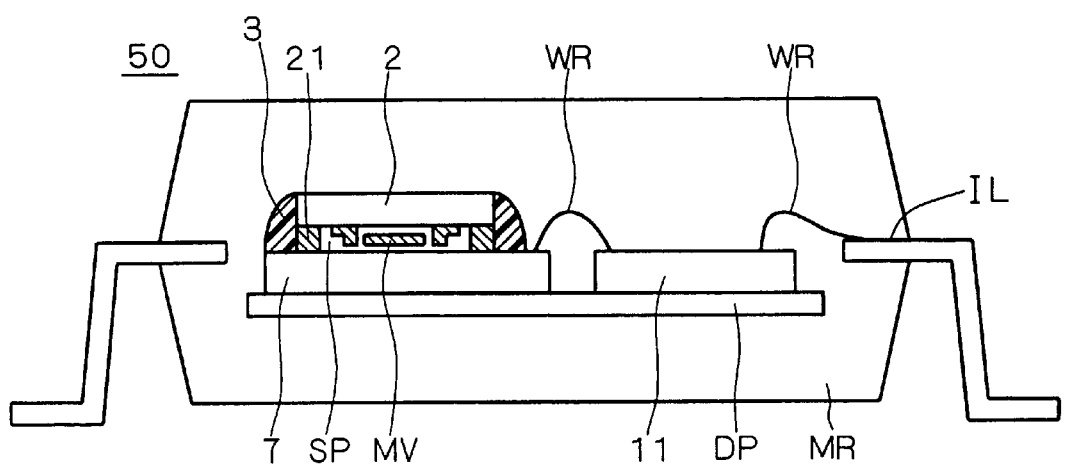
FIG. 10 is a cross section showing a structure of a semiconductor device in accordance with a fifth preferred embodiment of the present invention.

As the fifth preferred embodiment of the semiconductor device in accordance with the present invention, a cross section of a semiconductor device 50 is shown in FIG. 10.

In FIG. 10, a signal processing substrate 11 and a wiring board 7 are mounted on the same plane of the die pad DP of depressed die pad structure and the sensor substrate 2 is mounted on the wiring board 7.

The sensor substrate 2 has a plurality of bumps 21 on its main surface (the first main surface), and is a semiconductor substrate of flip chip bonding type to make an electrical connection with the wiring board 7 by bonding the bumps 21 to an electrode (not shown) provided on a main surface of the wiring board 7.

The wiring board 7 is made of ceramics such as alumina, on which the sensor substrate 2 is mounted, and comprises an interconnection layer (not shown) for outputting signals from the sensor substrate 2 and the electrode (not shown) connected to the bump 21 to the signal processing substrate 11 and the like and an output portion. Further, other constituent elements identical to those in the semiconductor device 10 described with reference to FIG. 1 are represented by the same reference signs and redundant description thereon will be omitted.

The height of the bump 21 is set so that the moving part MV may not come into contact with the main surface of the wiring board 7, and the wiring board 7 also serves as a stopper to prevent the moving electrode (not shown) which is a constituent of the moving part MV from unlimitedly moving in a direction opposite to the main surface of the sensor substrate 2.

The area of the wiring board 7 is larger than that of the sensor substrate 2, and the sealing resin 3 is so provided as to extend from the edge portion of the sensor substrate 2 onto the main surface of the wiring board 7. The sealing resin 3 is provided over the whole outer peripheral region of the sensor substrate 2, and the sealing resin 3, the sensor substrate 2 and the wiring board 7 define the sealed space SP.

The wiring board 7 and the signal processing substrate 11 are electrically connected with the wiring interconnection WR, and the signal processing substrate 11 is electrically connected to the inner lead IL through the wiring interconnection WR. The sensor substrate 2, the wiring board 7 and the signal processing substrate 11 are sealed by the mold resin MR together with the die pad DP and the inner lead IL.

Figure 11:
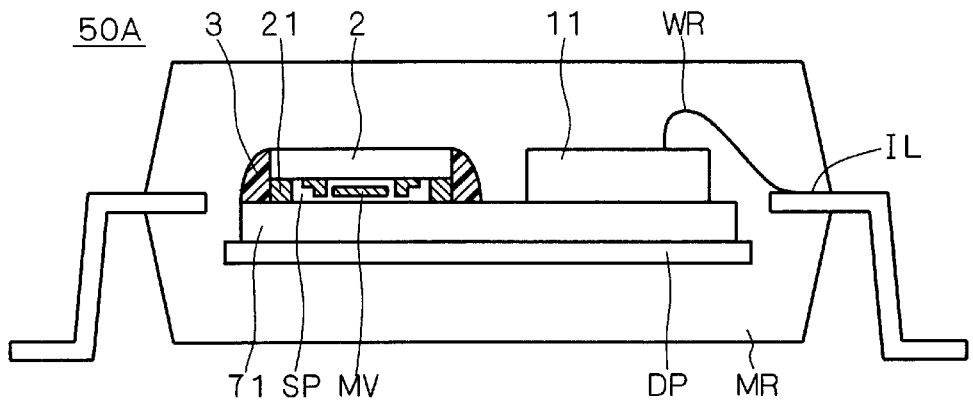

Further, though the wiring board 7 is provided only with the sensor substrate 2 thereon, this structure needs connection between the wiring board 7 and the signal processing substrate 11 with the wiring interconnection WR as described above. Then, like a semiconductor device 50A as shown in FIG. 11, a wiring board 71 which can be also provided with the signal processing substrate 11 thereon, instead of the wiring board 7, is used to electrically connect the sensor substrate 2 and the signal processing substrate 11 with an interconnection layer provided on the wiring board 71, and this eliminates the necessity of the wiring interconnection for electrical connection between the signal processing substrate 11 and the sensor substrate 2 and reduces the parasitic capacity.

Further, connection of the signal processing substrate 11 to the wiring board 7 may be performed by flip chip bonding like that of the sensor substrate 2.

E-2. Function and Effect

Thus, mounting the sensor substrate 2 on the wiring board 7 so that the moving part MV may face the main surface of the wiring board 7 and covering the edge portion of the sensor substrate 2 with the sealing resin 3 can prevent extraneous matters such as dust from entering the sealed space SP in the manufacturing stage and also prevent the molten mold resin MR from entering the sealed space SP in forming the mold resin MR, and therefore it is possible to prevent impediment to the operation of the moving electrode (not shown) which is a constituent of the moving part MV existing inside the sealed space SP.

E-3. The First Variation

Figure 12:
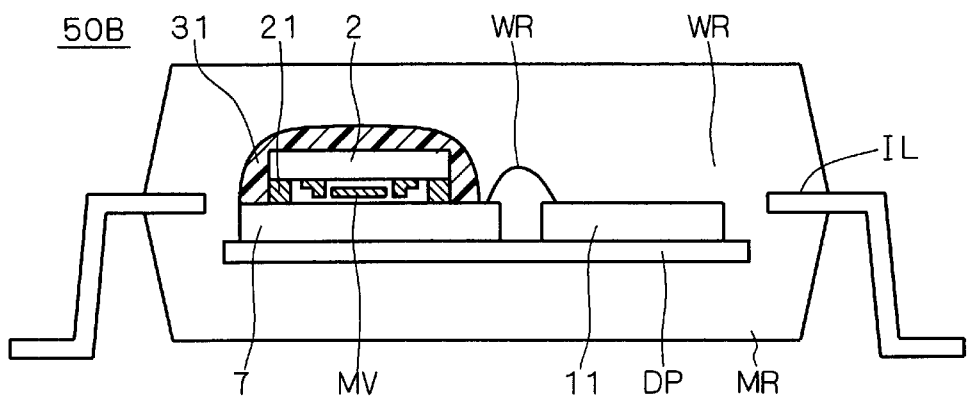

Though the semiconductor device 50 shown in FIG. 10 has the structure in which the sealing resin 3 is so provided as to cover only the edge portion of the sensor substrate 2, there may be another structure, like a semiconductor device 50B as shown in FIG. 12, in which the sealing resin 31 made of the silicone gel is used, instead of the sealing resin 3, to entirely cover the sensor substrate 2.

The sealing resin 31 made of silicone gel is a low-viscosity resin, and serves as a cushion against the external force by entirely covering the sensor substrate 2, to prevent the sensor substrate 2 from being distorted and broken with thermal stress generated in forming the mold resin MR applied to the sensor substrate 2.

Figure 13:
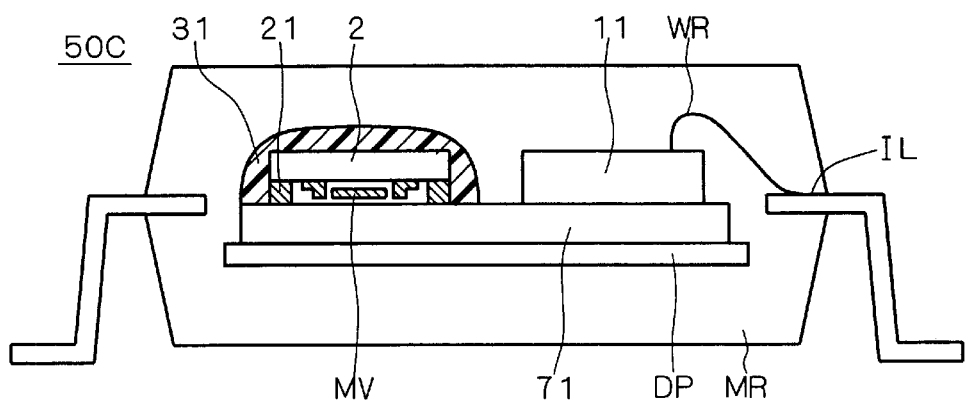

Further, though the wiring board 7 is provided only with the sensor substrate 2 thereon, the wiring board 71 which can be also provided with the signal processing substrate 11 thereon, instead of the wiring board 7, is used like a semiconductor device 50C as shown in FIG. 13, to electrically connect the sensor substrate 2 and the signal processing substrate 11 with the interconnection layer provided on the wiring board 71, and this eliminates the necessity of the wiring interconnection for electrical connection between the signal processing substrate 11 and the sensor substrate 2 and reduces the parasitic capacity.

E-4. The Second Variation

Though the semiconductor device 50B shown in FIG. 12 has the structure in which the sealing resin 31 of low viscosity is so provided as to entirely cover the sensor substrate 2, the silicone gel is rich in fluidity before hardening and therefore it is sometimes hard to stop it within a desired region on the wiring board 7 when it is applied thereto.

Figure 14:
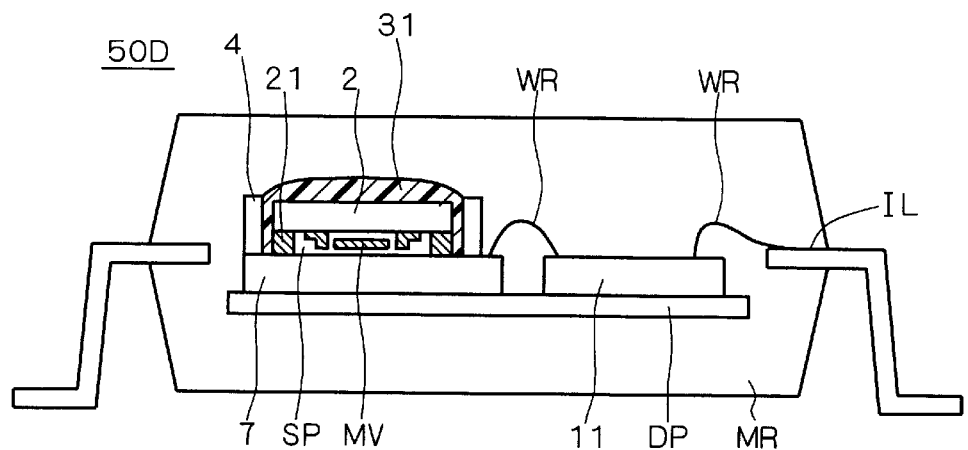

Then, there may be another structure, like a semiconductor device 50D as shown in FIG. 14, in which the barrier 4 is so provided as to surround the outer periphery of the sensor substrate 2 on the wiring board 7 and the silicone gel is flowed into the region surrounded by the barrier 4 to form the sealing resin 31.

The barrier 4 is made of resin or metal, and the barrier 4 of ring shape or rectangular-ring shape prepared in advance may be bonded to the wiring board 7.

Further, the sensor substrate 2 can be reliably covered only if the height of the barrier 4 is set not lower than such a height as to reach the second main surface of the sensor substrate 2 in a state where the barrier 4 is provided on the wiring board 7.

Figure 15:
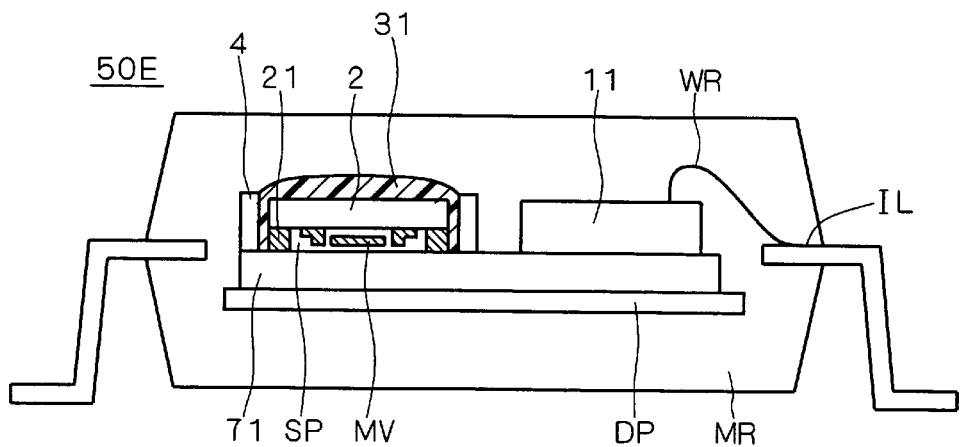

Further, though the wiring board 7 is provided only with the sensor substrate 2 thereon, the wiring board 71 which can be also provided with the signal processing substrate 11 thereon, instead of the wiring board 7, is used like a semiconductor device 50E as shown in FIG. 15, to electrically connect the sensor substrate 2 and the signal processing substrate 11 with the interconnection layer provided on the wiring board 71, and this eliminates the necessity of the wiring interconnection for electrical connection between the signal processing substrate 11 and the sensor substrate 2 and reduces the parasitic capacity.

E-5. The Third Variation

Figure 16:
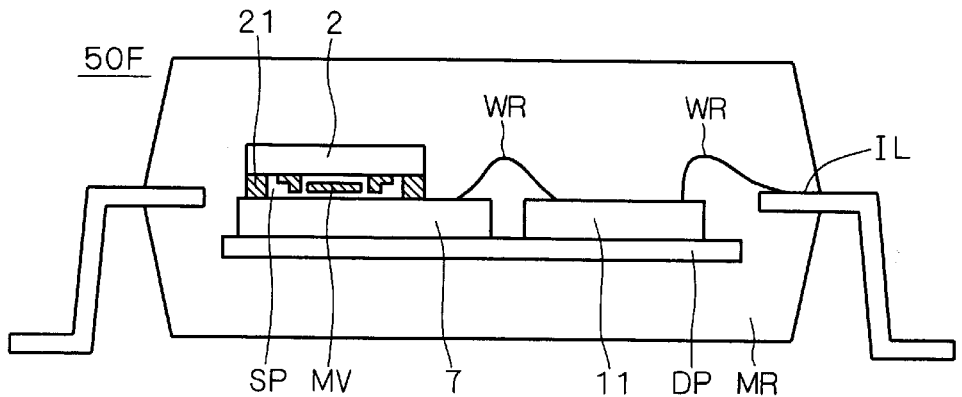

FIG. 16 shows a structure of a semiconductor device 50F. In FIG. 16, the signal processing substrate 11 and the wiring board 7 are mounted on the same plane of the die pad DP and the sensor substrate 2 is mounted on the wiring board 7.

The height of the bump 21 is set so that the gap GP between the sensor substrate 2 and the wiring board 7 may have a size not larger than 10 $\mu$m. Further, other constituent elements identical to those in the semiconductor device 50 described with reference to FIG. 10 are represented by the same reference signs and redundant description thereon will be omitted.

Further, though the wiring board 7 is provided only with the sensor substrate 2 thereon, the wiring board 71 which can be also provided with the signal processing substrate 11 thereon, instead of the wiring board 7, is used like a semiconductor device 50G as shown in FIG. 17, to electrically connect the sensor substrate 2 and the signal processing substrate 11 with the interconnection layer provided on the wiring board 71, and this eliminates the necessity of the wiring interconnection for electrical connection between the signal processing substrate 11 and the sensor substrate 2 and reduces the parasitic capacity.

E-6. The Fourth Variation

FIG. 18 shows a structure of a semiconductor device 50H. In FIG. 18, the signal processing substrate 11 and the wiring board 7 are mounted on the same plane of the die pad DP and the sensor substrate 2 is mounted on the wiring board 7. The sealing glass 5 made of low melting point glass is provided in the edge portion of the main surface of the sensor substrate 2 where the moving part MV is provided, along its entire perimeter, and the sealing glass 5, the sensor substrate 2 and the signal processing substrate 11 define the sealed space SP.

Further, though the wiring board 7 is provided only with the sensor substrate 2 thereon, the wiring board 71 which can be also provided with the signal processing substrate 11 thereon, instead of the wiring board 7, is used like a semiconductor device 50I as shown in FIG. 19, to electrically connect the sensor substrate 2 and the signal processing substrate 11 with the interconnection layer provided on the wiring board 71, and this eliminates the necessity of the wiring interconnection for electrical connection between the signal processing substrate 11 and the sensor substrate 2 and reduces the parasitic capacity.

E-7. The Fifth Variation

Figure 20:
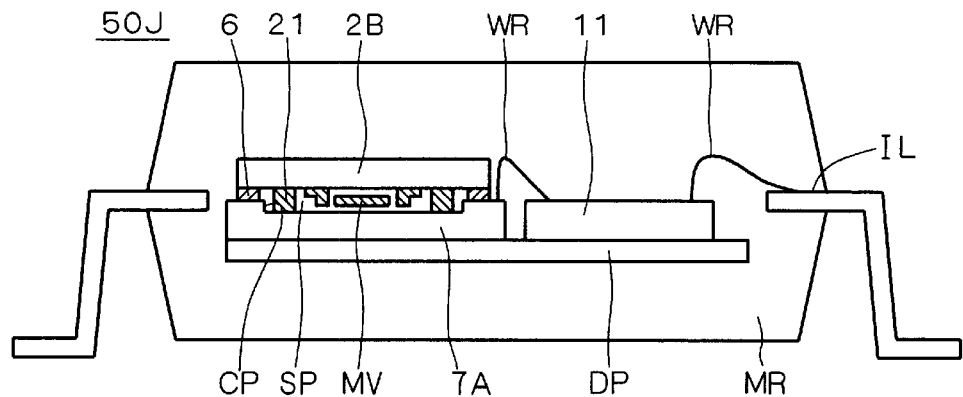

FIG. 20 shows a structure of a semiconductor device 50J. In FIG. 20, the signal processing substrate 11 and a wiring board 7A are mounted on the same plane of the die pad DP and the sensor substrate 2B is mounted on the wiring board 7A.

The sensor substrate 2B has the moving part MV provided on its main surface (the first main surface) and a plurality of bumps 21 provided around the moving part MV, and connecting the wiring board 7A and sensor substrate 2B by flip chip bonding makes the moving part MV face a main surface of the wiring board 7A. On the main surface of the wiring board 7A facing the moving part MV provided is the concave portion CP having a size corresponding to the region in which the bumps 21 and the moving part MV are formed.

The sealing wall 6 is provided between the edge portion of the first main surface of the sensor substrate 2B and an outer peripheral portion of the concave portion CP of the wiring board 7A, along the whole outer perimeter of the concave portion CP, and the sealing wall 6, the sensor substrate 2B and the wiring board 7A define the sealed space SP. The sealing wall 6 is made of eutectic alloy consisting of silicon, titanium and nickel.

Figure 21:
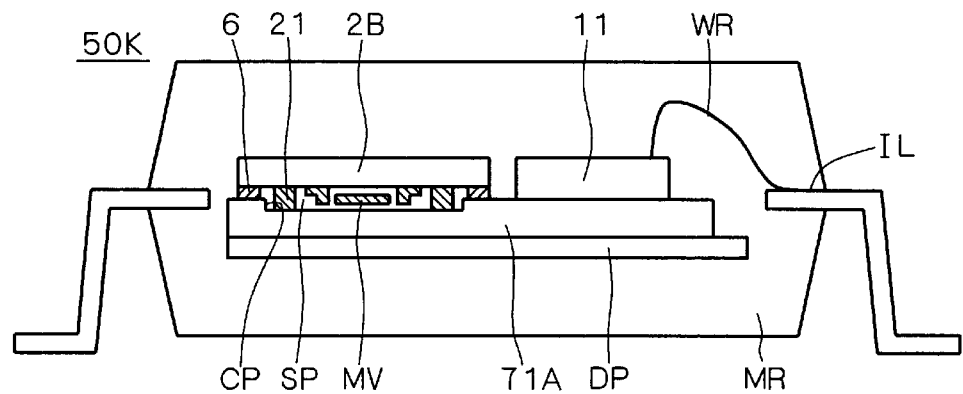

Further, though the wiring board 7A is provided only with the sensor substrate 2B thereon, a wiring board 71A which can be also provided with the signal processing substrate 11 thereon, instead of the wiring board 7A, is used like a semiconductor device 50K as shown in FIG. 21, to electrically connect the sensor substrate 2B and the signal processing substrate 11 with an interconnection layer provided on the wiring board 71A, and this eliminates the necessity of the wiring interconnection for electrical connection between the signal processing substrate 11 and the sensor substrate 2B and reduces the parasitic capacity.

F. The Sixth Preferred Embodiment

Though the semiconductor devices in accordance with the first to fifth preferred embodiments of the present invention as discussed above each have the structure in which the sensor substrate is used, instead of the cap CV in the background-art semiconductor device (see FIG. 27), to provide the structure omitting the cap CV on the lead frame, these structures are not limited to the application on the lead frame but may be applied to a TAB (Tape Automated Bonding), a hollow package, a BGA (Ball Grid Array), a CSP (Chip Size Package) and the like.

F-1. The First Application to TAB

Figure 22:
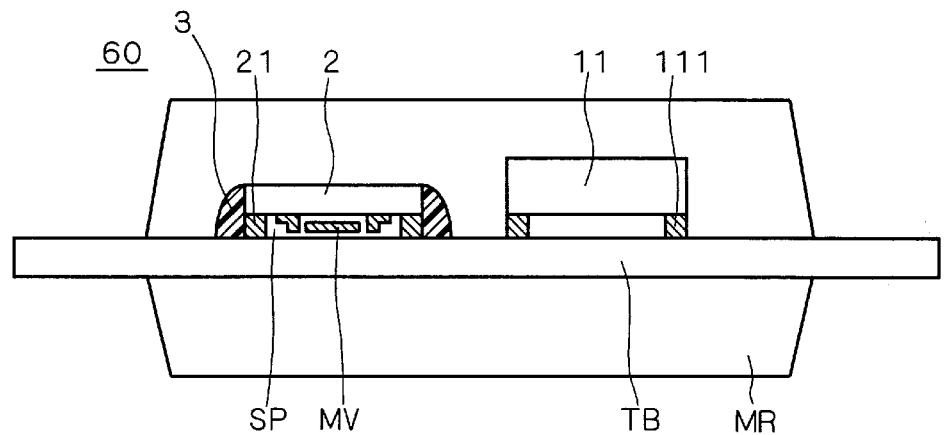
FIG. 22 is a cross section showing a structure of a semiconductor device in accordance with a sixth preferred embodiment of the present invention.

As the sixth preferred embodiment of the semiconductor device in accordance with the present invention, a cross section of a semiconductor device 60 is shown in FIG. 22.

In FIG. 22, the signal processing substrate 11 and the sensor substrate 2 are mounted on a TAB substrate TB.

The sensor substrate 2 is electrically connected to the TAB substrate TB by flip chip bonding, to make the moving part MV face a main surface of the TAB substrate TB.

On the TAB substrate TB provided are an electrode (not shown) connected to the bump 21 of the sensor substrate 2 and a protruding electrode 111 of the signal processing substrate 11, an interconnection layer (not shown) for electrically connecting the signal processing substrate 11 and the sensor substrate 2 and an output interconnection layer (lead). Further, other constituent elements identical to those in the semiconductor device 10 described with reference to FIG. 1 are represented by the same reference signs and redundant description thereon will be omitted.

Furthermore, a clearance is provided between the moving part MV and the main surface of the TAB substrate TB so as to prevent the moving part MV and the main surface of the TAB substrate TB from coming into contact with each other.

Thus, the moving part MV is so provided as not to come into contact with the main surface of the TAB substrate TB, and the TAB substrate TB also serves as a stopper to prevent the moving electrode (not shown) which is a constituent of the moving part MV from unlimitedly moving in a direction opposite to the main surface of the sensor substrate 2.

The sealing resin 3 is so provided as to extend from the edge portion of the sensor substrate 2 onto the main surface of the TAB substrate TB. The sealing resin 3 is provided over the whole outer peripheral region of the sensor substrate 2, and the sealing resin 3, the sensor substrate 2 and the TAB substrate TB define the sealed space SP.

Further, the sensor substrate 2, the signal processing substrate 11 and an element mounting portion of the TAB substrate TB are sealed by the mold resin MR and the output interconnection layer (not shown) extends outside the mold resin MR.

F-2. Function and Effect

Thus, mounting the sensor substrate 2 on the TAB substrate TB so that the moving part MV may face the TAB substrate TB and covering the edge portion of the sensor substrate 2 with the sealing resin 3 can prevent extraneous matters such as dust from entering the sealed space SP in the manufacturing stage and also prevent the molten mold resin MR from entering the sealed space SP in forming the mold resin MR, and therefore it is possible to prevent impediment to the operation of the moving electrode (not shown) which is a constituent of the moving part MV existing inside the sealed space SP.

Further, the TAB substrate TB may be termed interconnection substrate as it is a substrate on which the electrode and a wiring pattern are formed.

Furthermore, also in the BGA and the CSP, since a semiconductor chip is mounted on a substrate which may be termed interconnection substrate, like in the TAB substrate TB, the above structure and the following structure can be applied thereto.

F-3. The Second Application to TAB

Figure 23:
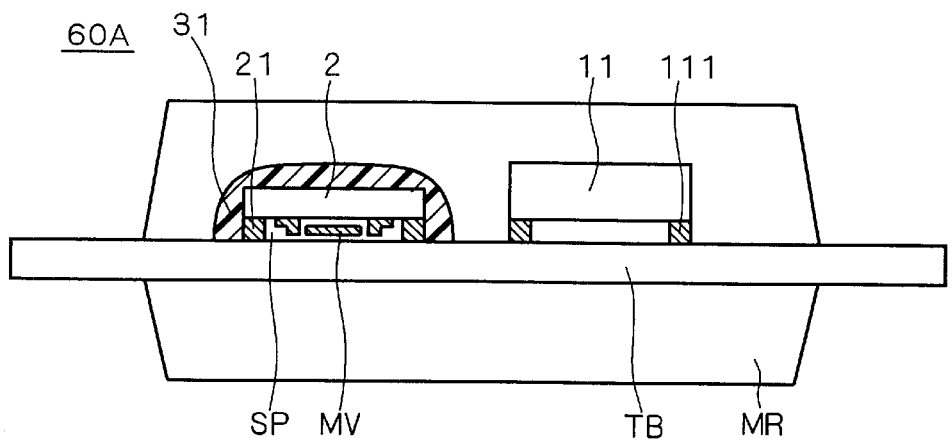
FIGS. 23 to 26 are cross sections showing structures of a semiconductor device in accordance with variations of the sixth preferred embodiment of the present invention.

Though the semiconductor device 60 shown in FIG. 22 has the structure in which the sealing resin 3 is so provided as to cover only the outer periphery of the edge portion of the sensor substrate 2, there may be another structure, like a semiconductor device 60A as shown in FIG. 23, in which the sealing resin 31 made of the silicone gel is used, instead of the sealing resin 3, to entirely cover the sensor substrate 2.

The sealing resin 31 made of silicone gel is a low-viscosity resin, and serves as a cushion against the external force by entirely covering the sensor substrate 2, to prevent the sensor substrate 2 from being distorted and broken with thermal stress generated in forming the mold resin MR applied to the sensor substrate 2.

F-4. The Third Application to TAB

Though the semiconductor device 60A shown in FIG. 23 has the structure in which the sealing resin 31 of low viscosity is so provided as to entirely cover the sensor substrate 2, the silicone gel is rich in fluidity before hardening and therefore it is sometimes hard to stop it within a desired region on the TAB substrate TB when it is applied thereto.

Figure 24:
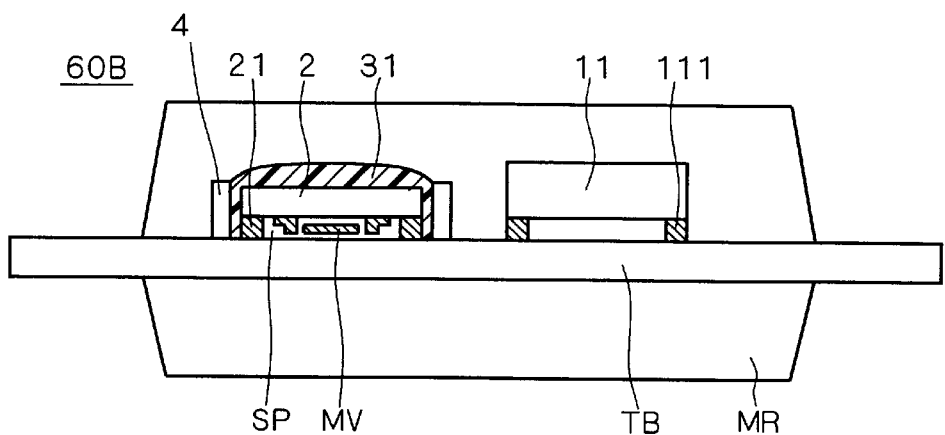

Then, there may be another structure, like a semiconductor device 60B as shown in FIG. 24, in which the barrier 4 is so provided as to surround the outer periphery of the sensor substrate 2 on the TAB substrate TB and the silicone gel is flowed into the region surrounded by the barrier 4 to form the sealing resin 31.

The barrier 4 is made of resin or metal, and the barrier 4 of ring shape or rectangular-ring shape prepared in advance may be bonded to the TAB substrate TB.

Further, the sensor substrate 2 can be reliably covered only if the height of the barrier 4 is set not lower than such a height as to reach the second main surface of the sensor substrate 2 in a state where the barrier 4 is provided on the TAB substrate TB.

F-5. The Fourth Application to TAB

Figure 25:
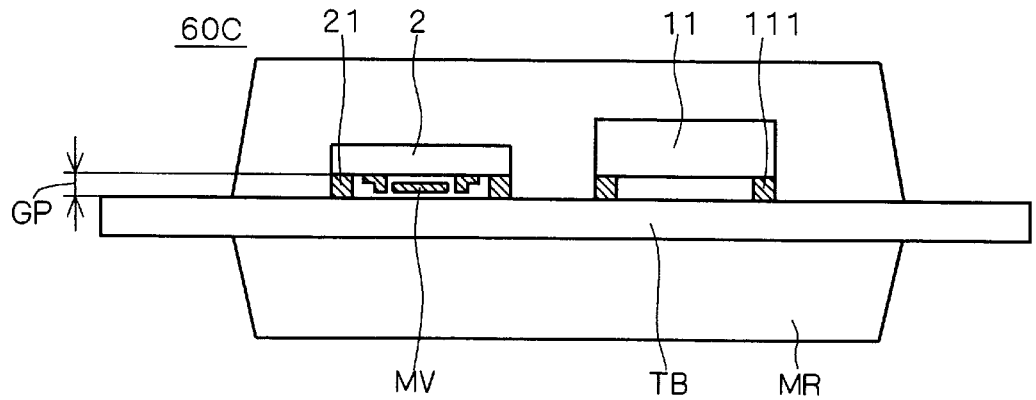

FIG. 25 shows a structure of a semiconductor device 60C. In FIG. 25, the signal processing substrate 11 and the sensor substrate 2 are mounted on the TAB substrate TB.

The height of the bump 21 is set so that the gap GP between the sensor substrate 2 and the TAB substrate Th may have a size not larger than 10 $\mu$m. Further, other constituent elements identical to those in the semiconductor device 60 described with reference to FIG. 22 are represented by the same reference signs and redundant description thereon will be omitted.

F-6. The Fifth Application to Hollow Package

Figure 26:
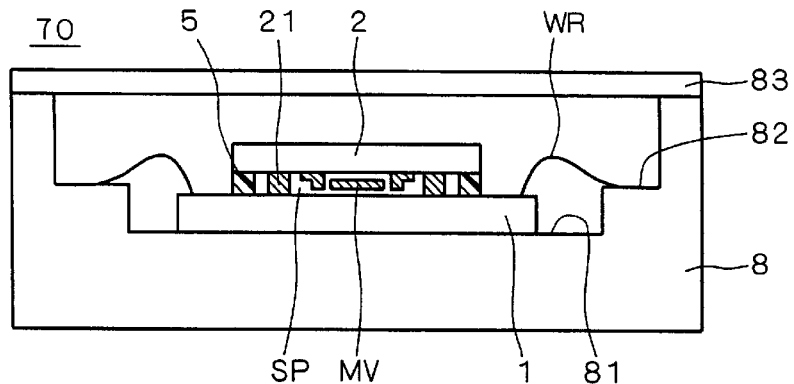

FIG. 26 shows a structure of a semiconductor device 70. FIG. 26 shows an exemplary structure in which the present invention is applied to the hollow package. The signal processing substrate 1 is mounted on a bottom portion 81 of a package container 8 made of ceramics or resin having steps inside, and the sensor substrate 2 is mounted on the signal processing substrate 1.

The sealing glass 5 made of low melting point glass is provided in the edge portion of the main surface of the sensor substrate 2 where the moving part MV is provided, along its entire perimeter, and the sealing glass 5, the sensor substrate 2 and the signal processing substrate 1 define the sealed space SP.

The signal processing substrate 1 is electrically connected to a not-shown output interconnection layer (lead) provided on a step portion 82 inside the package container 8 through the wiring interconnection WR.

Finally, an open portion of the package container 8 is covered with a cover 83, to seal the signal processing substrate I and the sensor substrate 2.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a sensor substrate comprising a moving part on a first main surface thereof, for converting the displacement of said moving part into an electrical signal and outputting said electrical signal;
an opposed substrate opposed to said first main surface of said sensor substrate, for transmitting said electrical signal with said sensor substrate through a bump provided around said moving part; and
a sealing member provided at least in an edge portion of a gap defined by said sensor substrate and said opposed substrate,
wherein a sealed space is defined by said sensor substrate, said opposed substrate and said sealing member.

2. The semiconductor device according to claim 1, wherein
said opposed substrate is a signal processing substrate for performing a predetermined processing on said electrical signal from said sensor substrate, and
said sensor substrate is provided on said signal processing substrate.

3. The semiconductor device according to claim 2, wherein
said sealing member is made of resin and so provided as to cover only said edge portion of said gap defined by said sensor substrate and said opposed substrate.

4. The semiconductor device according to claim 2, wherein
said sealing member is made of resin and so provided as to entirely cover said sensor substrate.

5. The semiconductor device according to claim 4, wherein
said resin is silicone gel.

6. The semiconductor device according to claim 4, further comprising:
a barrier provided so as to surround at least said sensor substrate, having such a height as to reach a second main surface opposite to said first main surface of said sensor substrate,
wherein said resin is so provided as to fill the inside of said barrier.

7. The semiconductor device according to claim 2, wherein
said sealing member is made of glass and provided between an edge portion of said first main surface of said sensor substrate and a main surface of said opposed substrate.

8. The semiconductor device according to claim 7, wherein
said glass includes at least PbO.

9. The semiconductor device according to claim 2, wherein
said sealing member is made of eutectic alloy including at least silicon and provided between an edge portion of said first main surface of said sensor substrate and a main surface of said opposed substrate.

10. The semiconductor device according to claim 9, wherein
said opposed substrate comprises a concave portion provided in said main surface of said opposed substrate correspondingly to a region in which said moving part and said bump of said sensor substrate are provided, and
said moving part and said bump are partially contained in said concave portion.

11. The semiconductor device according to claim 1, further comprising
a signal processing substrate for performing a predetermined processing on said electrical signal from said sensor substrate,
wherein said opposed substrate is a wiring board having a wiring pattern to transmit said electrical signal from said sensor substrate to said signal processing substrate, and
said sensor substrate is provided on said wiring board.

12. The semiconductor device according to claim 11, wherein
said sealing member is made of resin and so provided as to cover only said edge portion of said gap defined by said sensor substrate and said opposed substrate.

13. The semiconductor device according to claim 11, wherein
said sealing member is made of resin and so provided as to entirely cover said sensor substrate.

14. The semiconductor device according to claim 13, wherein
said resin is silicone gel.

15. The semiconductor device according to claim 13, further comprising:
a barrier provided so as to surround at least said sensor substrate, having such a height as to reach a second main surface opposite to said first main surface of said sensor substrate,
wherein said resin is so provided as to fill the inside of said barrier.

16. The semiconductor device according to claim 11, wherein
said sealing member is made of glass and provided between an edge portion of said first main surface of said sensor substrate and a main surface of said opposed substrate.

17. The semiconductor device according to claim 16, wherein
said glass includes at least PbO.

18. The semiconductor device according to claim 11, wherein
said sealing member is made of eutectic alloy including at least silicon and provided between an edge portion of said first main surface of said sensor substrate and a main surface of said opposed substrate.

19. The semiconductor device according to claim 18, wherein
said opposed substrate comprises a concave portion provided in said main surface of said opposed substrate correspondingly to a region in which said moving part and said bump of said sensor substrate are provided, and
said moving part and said bump are partially contained in said concave portion.

20. A semiconductor device comprising:
a sensor substrate comprising a moving part on a first main surface thereof, for converting the displacement of said moving part into an electrical signal and outputting said electrical signal; and
an opposed substrate opposed to said first main surface of said sensor substrate, for transmitting said electrical signal with said sensor substrate through a bump provided around said moving part,
wherein a gap defined by said sensor substrate and said opposed substrate has a size not smaller than 2 $\mu$m and not larger than 10 $\mu$m.

* * * * *